(12) United States Patent
Kim et al.

(10) Patent No.: US 8,338,897 B2
(45) Date of Patent: Dec. 25, 2012

(54) CONDUCTIVE NANOMEMBRANE, AND MEMS SENSOR OF USING THE SAME

(75) Inventors: Yong Hyup Kim, Seoul (KR); Jung Hoon Lee, Seoul (KR); Tae June Kang, Seoul (KR); Eui Yun Jang, Jeju-si (KR)

(73) Assignee: SNU R&DB Foundation, Seoul (KR)

( * ) Notice: Subject to any disclaimer, the term of this patent is extended or adjusted under 35 U.S.C. 154(b) by 276 days.

(21) Appl. No.: 12/674,148

(22) PCT Filed: Apr. 3, 2008

(86) PCT No.: PCT/KR2008/001883
§ 371 (c)(1),
(2), (4) Date: Feb. 18, 2010

(87) PCT Pub. No.: WO2009/123371
PCT Pub. Date: Oct. 8, 2009

(65) Prior Publication Data
US 2011/0031566 A1    Feb. 10, 2011

(51) Int. Cl.
*G01L 9/00* (2006.01)
(52) U.S. Cl. ............... 257/417; 257/E29.324; 428/688; 428/500; 428/457; 428/480
(58) Field of Classification Search ............ 257/419
See application file for complete search history.

(56) References Cited

U.S. PATENT DOCUMENTS

| | | | | |
|---|---|---|---|---|
| 6,902,658 B2 * | 6/2005 | Talin et al. | | 204/484 |
| 7,851,294 B1 * | 12/2010 | Basco et al. | | 438/211 |
| 2005/0175507 A1 * | 8/2005 | Tsukruk | | 422/68.1 |
| 2005/0262943 A1 * | 12/2005 | Claydon et al. | | 73/579 |
| 2006/0063464 A1 * | 3/2006 | Kang et al. | | 445/51 |
| 2006/0188774 A1 * | 8/2006 | Niu et al. | | 429/44 |
| 2006/0283262 A1 * | 12/2006 | Smits et al. | | 73/799 |
| 2007/0114138 A1 * | 5/2007 | Krasteva et al. | | 205/787 |
| 2008/0023066 A1 * | 1/2008 | Hecht et al. | | 136/256 |
| 2009/0118420 A1 * | 5/2009 | Zou et al. | | 524/577 |
| 2010/0068461 A1 * | 3/2010 | Wallace et al. | | 428/156 |
| 2010/0096004 A1 * | 4/2010 | Hu et al. | | 136/256 |
| 2010/0137528 A1 * | 6/2010 | Sample et al. | | 525/455 |
| 2010/0178543 A1 * | 7/2010 | Gruner et al. | | 429/121 |
| 2010/0179054 A1 * | 7/2010 | Swager et al. | | 502/162 |

(Continued)

FOREIGN PATENT DOCUMENTS

CN   200880102146.x   3/2012

(Continued)

OTHER PUBLICATIONS

X. Yu, et al "Fabrication of carbon nanotube based transparent conductive thin films using layer-by-layer technology" Surface & Coatings Technology 202 ( 2008) 2002-2007.

(Continued)

*Primary Examiner* — N Drew Richards
*Assistant Examiner* — Ankush Singal
(74) *Attorney, Agent, or Firm* — Workman Nydegger (57) ABSTRACT

The present invention relates to a conductive nanomembrane and a Micro Electro Mechanical System sensor using the same, and more particularly, a conductive nanomembrane that is formed by stacking a polymer electrolyte film and a carbon nanotube layer, and a MEMS sensor using the same.

12 Claims, 7 Drawing Sheets

U.S. PATENT DOCUMENTS

2010/0215945 A1*  8/2010  Ota et al. .................. 428/323
2010/0233585 A1*  9/2010  Niu et al. ................... 429/523
2010/0296340 A1* 11/2010  Basco et al. ............ 365/185.18

FOREIGN PATENT DOCUMENTS

| | | |
|---|---|---|
| KR | 1020010099655 A | 11/2001 |
| KR | 1020020003464 A | 1/2002 |
| KR | 1020050057680 A | 6/2005 |
| KR | 100828477 B1 | 5/2008 |

OTHER PUBLICATIONS

X.Yu; Fabrication of carbon nanotube based transparent conductive thin films using layer-by-layer technology, Science Direct, Surface and Coating Technology 202 (2008), Department of Mechanical Engineering, University of Minnesota, available Sep. 7, 2007.

* cited by examiner

CONDUCTIVE NANOMEMBRANE, AND MEMS SENSOR OF USING THE SAME

TECHNICAL FIELD

The present invention relates to a conductive nanomembrane and a Micro Electro Mechanical System (hereinafter, referred to as "MEMS") sensor using the same, and more particularly, a conductive nanomembrane that is formed by stacking a polymer electrolyte film and a carbon nanotube layer, and a MEMS sensor using the same.

BACKGROUND ART

Recently, biotechnology has brought development of new research and industrial fields through technical cooperation and fusion with various science fields. Particularly, BIT (Bio-Information technology) has been developed by using technologies that has been researched in the field of semiconductor technology, and BINT (Bio-Information Nanotechnology) has been developed as a new technological field by fusion with Micro/Nano technology. The fusion biotechnology has been actively researched because it can greatly contribute in analyzing functions and interaction of biomaterials in the fields of disease diagnosis, new medicine development and signaling system analysis that has been importantly researched in the biotechnological fields at present. Particularly, a bio-sensor has been actively researched as a bio-diagnosis technology.

The bio-sensor is a hybrid device of a semiconductor chip type that is formed by integrating and mixing substances such as DNA (deoxyribonucleicacid), protein, enzyme, antibody, microorganism, animal or plant cell and organ and neuron cell in a solid substrate formed of inorganic material such as a semiconductor in high density. The bio-sensor is used to obtain biological information such as expression of gene, gene combination and protein distribution, or to increase biochemical process and reaction speeds or information processing speed. The bio-sensor is roughly classified into a bio-optical detection method and a bio-mechanical detection method.

The bio-optical detection method is a method of detecting reaction of phosphorylated biomaterial using a fluorescent microscope, and includes an ELISA (enzyme-linked immunosorbent assays), FRET (fluorescence resonance energy transfer) and a method using electrophoresis typically. The bio-mechanical detection method is a method of directly detecting change of surface energy generated during chemical reaction of biomaterial as mechanical displacement. The bio-mechanical detection method does not require process of attaching phosphorous material during detection procedure (label-free), and have high detection resolution, and can be reused. Thus, recently, the fusion biotechnologies have been researched actively.

By using a lap-on-a-chip, it is possible to perform various processes such as separation, purification, mixing, reaction and detection of a sample on a single chip by using the MEMS technology. The lap-on-a-chip technology is a method that can continuously analyze various samples of very small amount, perform high-speed analysis and miniaturize a size of the entire device. Thus, the lap-on-a-chip is suitable for a portable device.

A conventional bio-diagnosis technology requires high-scale and expensive instruments because the bio-diagnosis technology uses a bio-optical analysis method mainly. However, the lap-on-a-chip provides a technology that can miniaturize the instruments by using the MEMS technology. The lap-on-a-chip has many advantages, but has problems such as development of methods for precise fluid flow control and highly sensitive detection for commercialization.

Particularly, in the field of a bio-sensor, fluid flow channel formation technology, pump, valve have been actively researched with development of the MEMS technology. However, there is a difficult problem that a laser and a spectrophotometer should be miniaturized to manufacture the conventional bio-sensors based on the optical analysis method in the type of the lap-on-a-chip.

A bio-mechanical detection analysis using a fine cantilever arrangement requires pre-treatment processes such as thin gold film deposition and surface treatment for immobilization of biomaterial. In addition, the bio-mechanical detection analysis requires a laser-displacement measuring system for measuring displacement of nanometer scale generated by reaction of the biomaterial. In addition, the bio-mechanical detection analysis method has a disadvantage in that it is very sensitive to temperature because of bimetal effect caused by differences of thicknesses and thermal expansion coefficients of the cantilever structure (silicon nitride film) and thin gold film.

Accordingly, development of a bio-sensor for a high performance lap-on-a-chip by using a bio-compatible material and a new detection method has been strongly demanded.

DISCLOSURE

Technical Problem

An object of the present invention is to provide a conductive nanomembrane that is formed by stacking a polymer electrolyte film and a carbon nanotube layer, and a MEMS sensor using the same.

Additional advantages, objects and features of the invention will be set forth in part in the description which follows and in part will become apparent to those having ordinary skill in the art upon examination of the following or may be learned from practice of the invention.

Technical Solution

According to an aspect of the present invention, there is provided a conductive nanomembrane, which includes a lower polymer electrolyte film and a carbon nanotube layer formed on the polymer electrolyte film, where networks of carbon nanotubes are formed in the carbon nanotube layer.

In addition, the conductive nanomembrane may further include an upper polymer electrolyte film formed on the carbon nanotube layer. Here, the lower and upper polymer electrolyte films may be respectively formed of any one resin selected from a group of PAH, PSS, PVP, PAA, PPy, PANI, PTs and PEDOT.

The carbon nanotube of the carbon nanotube layer may be functionalized with carboxyl and hydroxy groups, and may have negative charges by hydrogen ions that are released from the carbon nanotube layer in aqueous solution. In this time, the lower polymer electrolyte film may be formed by stacking PAH and PSS alternatively, and the uppermost layer contacted to the carbon nanotube layer may be formed of PAH. On the other hand, the upper polymer electrolyte film is formed by stacking PAH and PSS alternatively, and the lowermost layer contacted to the carbon nanotube layer is formed of PAH. In addition, the lower and upper polymer electrolyte films may be formed by a dipping self-assembly method or a spin-assisted self-assembly method.

In addition, the conductive nanomembrane may further comprise an upper metal layer formed of any one selected from a group of copper, gold, silver and platinum.

According to another aspect of the present invention, there is provided a micro electro mechanical system sensor, which include: a substrate provided with an opening; a conductive nanomembrane formed on the substrate; an upper plate, provided on the conductive nanomembrane, being spaced from the conductive nanomembrane by a spacer; a lower plate provided under the substrate; and an upper electrode, formed under the upper plate, being spaced from an upper surface of the conductive nanomembrane.

The conductive nanomembrane may be exposed through an opening of the spacer.

In addition, the micro electro mechanical system sensor may be used as a pressure sensor, a humidity sensor, a temperature sensor, a contact sensor or a biochemical sensor according to an object to be sensed.

Advantageous Effects

The conductive nanomembrane according to the present invention produces following effects.

First, a thin conductive nanomembrane having excellent mechanical and electrical properties can be manufactured by using the polymer electrolyte film and carbon nanotube layer.

Second, a MEMS sensor using change of capacitance can be manufactured by using the conductive nanomembrane having electrical conductivity.

Third, detection resolution and reliability of the sensor can be improved by using the conductive nanomembrane.

Fourth, a bio-sensor capable of directly fixing biomaterial such as DNA can be manufactured by using the conductive nanomembrane including the polymer electrolyte film and carbon nanotube layer.

DESCRIPTION OF DRAWINGS

The above and other objects, features and advantages of the present invention will be more apparent from the following detailed description taken in conjunction with the accompanying drawings, in which.

BEST MODE

Hereinafter, preferred embodiments of the present invention will be described in detail with reference to the accompanying drawing. The aspects and features of the present invention and methods for achieving the aspects and features will be apparent by referring to the embodiments to be described in detail with reference to the accompanying drawings. However, the present invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the present invention is only defined within the scope of the appended claims. In the entire description of the present invention, the same drawing reference numerals are used for the same elements across various figures. In addition, shapes and thicknesses of each layer and materials constituting a conductive nanomembrane are exaggerated or simplified for convenience.

An object of the present invention is to manufacture a conductive nanomembrane by using a carbon nanotube and polymer electrolyte, and to improve detection resolution by applying the conductive nanomembrane in a MEMS sensor based on capacitance change measurement. The carbon nanotube has excellent physical properties to improve electrical and mechanical properties of the conductive nanomembrane. In addition, performance and reliability of the MEMS sensor using the conductive nanomembrane are improved.

First, the conductive nanomembrane according to one exemplary embodiment will be explained below.

Figure 1:
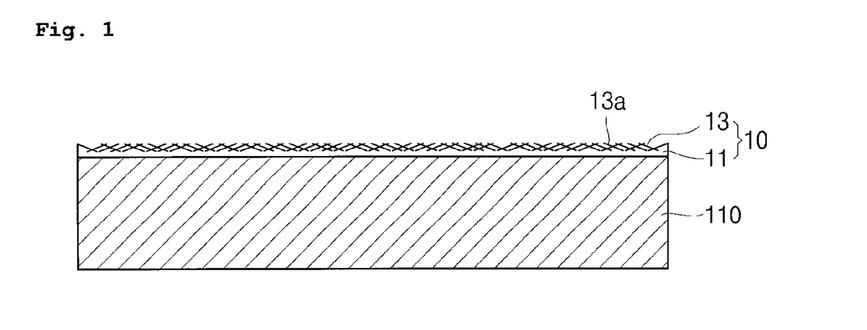
FIG. 1 is a sectional view illustrating a conductive nanomembrane according to one exemplary embodiment of the present invention.
Figure 2:
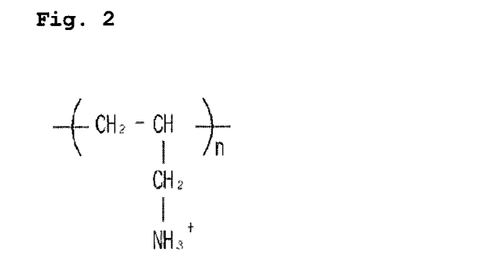
FIG. 2 is a structural formula of PAH.
Figure 3:
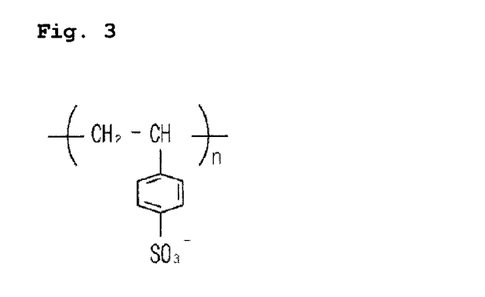
FIG. 3 is a structural formula of PSS.
Figure 4:
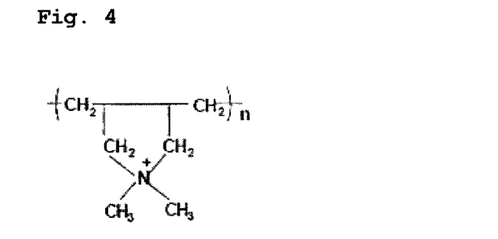
FIG. 4 is a structural formula of PDAC.
Figure 5:
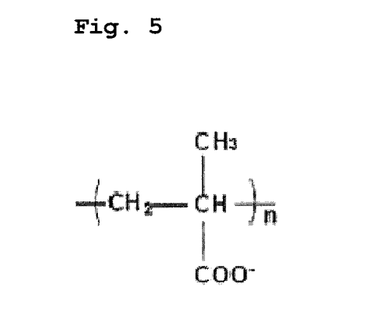
FIG. 5 is a structural formula of PMA.
Figure 6:
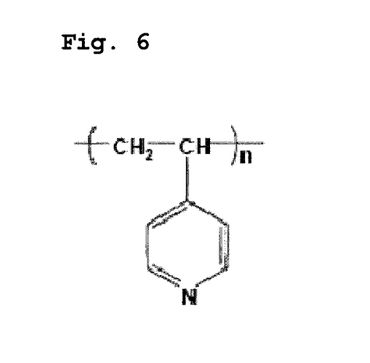
FIG. 6 is a structural formula of PVP.
Figure 7:
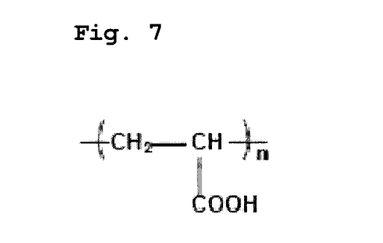
FIG. 7 is a structural formula of PAA.
Figure 8:
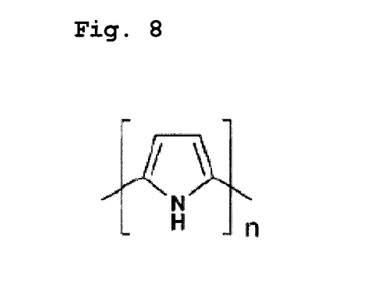
FIG. 8 is a structural formula of PPy.
Figure 9:
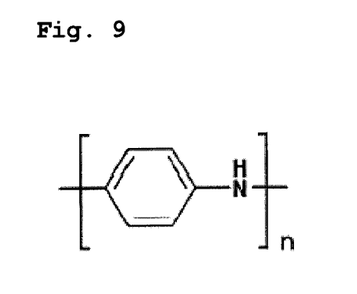
FIG. 9 is a structural formula of PANI.
Figure 10:
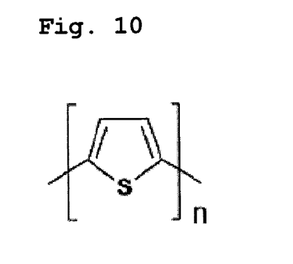
FIG. 10 is a structural formula of PTs.
Figure 11:
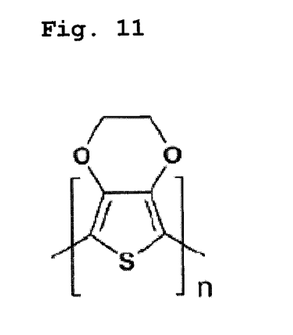
FIG. 11 is a structural formula of PEDOT.
Figure 12:
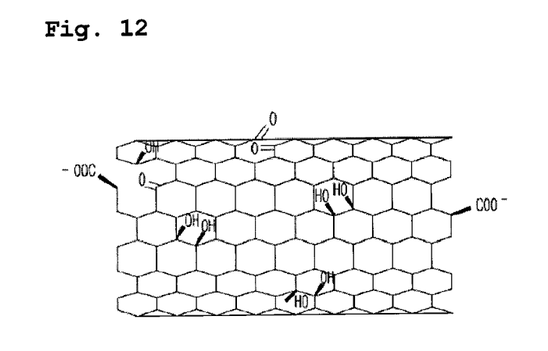
FIG. 12 is a conceptual view illustrating a functionalized carbon nanotube according to the embodiment of the present invention.

FIG. 1 is a sectional view illustrating the conductive nanomembrane according to one exemplary embodiment of the present invention and FIG. 2 is a structural formula of PAH and FIG. 3 is a structural formula of PSS and FIG. 4 is a structural formula of PDAC and FIG. 5 is a structural formula of PMA and FIG. 6 is a structural formula of PVP and FIG. 7 is a structural formula of PAA and FIG. 8 is a structural formula of PPy and FIG. 9 is a structural formula of PANI and FIG. 10 is a structural formula of PTs and FIG. 11 is a structural formula of PEDOT and FIG. 12 is a conceptual view illustrating a functionalized carbon nanotube according to the embodiment of the present invention.

Referring to FIG. 1, the conductive nanomembrane 10 includes a carbon nanotube layer 13 and a lower polymer electrolyte film 11 formed on a substrate 110. The conductive nanomembrane 10 is formed of the lower polymer electrolyte film 11 and the carbon nanotube layer 13, and can be used in various sensors.

The lower polymer electrolyte film 11 is formed on the substrate 110 as a membrane layer. Desirably, the lower polymer electrolyte film 11 may be formed in multi-layers. Or, the lower polymer electrolyte film 11 may be formed in a single layer. In addition, the lower polymer electrolyte film 11 is formed in a membrane of nano-thickness.

The lower polymer electrolyte film 11 may be made of a membrane formed by electrostatic force between molecules, a membrane formed by hydrogen bonding, or a membrane formed by pi-pi interaction. In other words, various polymers may be used in the lower polymer electrolyte film 11 depending on the principle of formation.

The membrane formed by electrostatic force between molecules may be formed of any one resin selected from a group of poly(allylaminehydrochloride) (hereinafter, referred to as "PAH"), poly(sodium styrene sulfonate) (hereinafter, referred to as "PSS"), diallyldimethylammonium chloride (hereinafter, referred to as "PDAC") and poly(methyl acrylate) (hereinafter, referred to as "PMA"). FIG. 2 is a structural formula of PAR and FIG. 3 is a structural formula of PSS and FIG. 4 is a structural formula of PDAC and FIG. 5 is a structural formula of PMA.

Particularly, the membrane formed by electrostatic force between molecules may be formed of PAH and PSS that are polymer electrolyte having positive charge. When the lower polymer electrolyte film 11 is formed in multi-layers, it is formed by stacking PAH and PSS repeatedly.

PAH having positive charge is stacked at the uppermost layer of the lower polymer electrolyte film 11. The carbon nanotube layer 13 is functionalized with carboxyl and hydroxyl groups. Hydrogen ions of the carbon nanotube layer 13 are released in aqueous solution and thus the carbon nanotube layer 13 has negative charge. Accordingly, the uppermost layer of the lower polymer electrolyte film 11 is formed of PAH, where the carbon nanotube layer 13 is formed. Chemical bonds are formed between the lower polymer electrolyte film 11 and carbon nanotube layer 13. In other words, amine group (NH2) of PAH of the lower polymer electrolyte film 11 and carboxyl group (COOH) of the carbon nanotube are combined to each other to form strong electrostatic chemical bonding between the lower polymer electrolyte film 11 and carbon nanotube layer 13.

On the other hand, a thickness of the conductive nanomembrane 10 can be adjusted by controlling the number of stacking PAH and PSS in the lower polymer electrolyte film 11. The lower polymer electrolyte film 11 is formed in thickness of a few nanometer to tens of hundreds nanometer.

The membrane formed by hydrogen bonding may be formed of poly(4-vinyl pyridine)(hereinafter, referred to as "PVP") and poly(acrylic acid) (hereinafter, referred to as "PAA"). FIG. 6 is a structural formula of PVP and FIG. 7 is a structural formula of PAA.

The membrane formed by hydrogen bonding is formed by hydrogen bonds between nitrogen having electronegativity on the surface of PVP and hydrogen on the surface of PAA. Thus, the membrane formed by hydrogen bonding can be stably stacked by the hydrogen bonds.

The membrane formed by pi-pi interaction may be formed of any one resin selected from a group of polypyrrole (hereinafter, referred to as polyaniline (hereinafter, referred to as "PANI"), polythiophenes (hereinafter, referred to as "PTs") and poly(3,4-ethylenedioxythiophene) (hereinafter, referred to as "PEDOT") that are conductive resin. The conductive resins have conductivity due to pi electrons. Thus, the membrane formed by pi-pi interaction can be stably stacked by covalent bonds formed by pi electrons between the conductive resins.

FIG. 8 is a structural formula of PPy and FIG. 9 is a structural formula of PANI and FIG. 10 is a structural formula of PTs and FIG. 11 is a structural formula of PEDOT.

The lower polymer electrolyte film 11 is formed by using layer-by-layer self-assembly phenomenon. The layer-by-layer self-assembly method includes a dipping self-assembly method or a spin-assisted self-assembly method.

The lower polymer electrolyte film 11 formed by the dipping self-assembly method will be explained below. The lower polymer electrolyte film 11 is formed by stacking PAH and PSS alternatively on the substrate 110. More particularly, first the substrate 110 substituted with negative charge is dipped into aqueous solution of PAH that is polymer having positive charge, and then PAH is adsorbed on the upper surface of the substrate 110 by electrostatic force. The substrate 110 adsorbing PAH is dipped into water that is cleaning solvent, and then PAH weakly adsorbed on the upper surface of the substrate 110 is removed. The PAR relatively strongly adsorbed on the upper surface of the substrate 110 form a polymer electrolyte film, and the substrate is positively charged due to positive charge of the PAH. Next, the substrate 110 coated with PAH is dipped into aqueous solution of PSS that has negative charge, and then PSS is adsorbed on the PAH. The substrate 110 adsorbing PSS is dipped into water that is cleaning solvent, and then PSS weakly adsorbed on the upper surface of the substrate 110 is removed. The PSS relatively strongly adsorbed on the upper surface of the substrate 110 form a polymer electrolyte film. A plurality of lower polymer electrolyte films 11 are formed on the substrate 110 by repeating above processes.

The spin-assisted self-assembly method is a method of forming a polymer electrolyte film by spin coating. The spin-assisted self-assembly method has a shorter process time and can form a polymer electrolyte film having higher alignment in comparison to the dipping self-assembly method. The spin coating can be performed at 4,000 rpm for about 20 seconds by using aqueous solution of polymer electrolyte. Weakly adsorbed residual polymer electrolyte is washed with water to form a membrane by electrostatic force.

The carbon nanotube layer 13 is formed of many carbon nanotubes 13a. In the carbon nanotube layer 13, the carbon nanotubes may be form networks. Referring to FIG. 12, the carbon nanotube layer 13 is formed of the carbon nanotube 13a that is functionalized with carboxyl and hydroxyl groups. The carbon nanotube 13a functions as filler that improves both mechanical property and electrical conductivity of the conductive nanomembrane 10. It is desirable that the carbon nanotube is a single wall carbon nanotube having high purity more than 95%. A structure of the carbon nanotube should not be damaged to use unique excellent mechanical and electrical properties thereof effectively.

The carbon nanotube layer 13 is formed of pre-treated carbon nanotube to prevent delamination of the lower polymer electrolyte film 11 and increase stacking strength. By the pre-treatment, the carbon nanotube is functionalized with carboxyl and hydroxyl groups and charged negatively by releasing hydrogen ions in aqueous solution, thereby allowing the carbon nanotube to be electrostatically combined to the polymer electrolyte having positive charge. In addition, by the pre-treatment, impurities adsorbed during manufacturing process of the carbon nanotube are removed.

The pre-treatment process of the carbon nanotube is performed as below. Manufactured carbon nanotube bundle includes metal catalyst, amorphous carbon layer, carbon nano-particle and the like during manufacturing process. Accordingly, the impurities should be removed before the carbon nanotube is stacked with the polymer electrolyte. In addition, the carbon nanotube should be formed in proper size to be stacked uniformly as a monolayer.

The carbon nanotube bundle of 10 g/liter is put in nitric acid (HNO3) solution. Then, humid oxidation is performed by heating the solution at 50° C. for one hour. The amorphous carbon and carbon nano-particles are oxidized contained in the carbon nanotube bundle and the metal catalyst are removed. In addition, the oxidized carbon nanotube is functionalized with carboxyl and hydroxyl groups to have electrostatic repulsion force between the carbon nanotubes.

The carbon nanotube oxidized by purification in the nitric acid solution is neutralized by ultra-pure water and filtered through a filter and dispersed in methanol that is a dispersing solvent. The oxidized carbon nanotubes have electrostatic repulsion force and can be effectively dispersed in the solvent.

The dispersing solvent containing the carbon nanotube is treated by ultrasonic wave of 45 Hz for 10 to 20 hours. By the ultrasonic wave treatment, the carbon nanotube is cut in a length of 1 to 2 μm, and metal catalyst attached to the end is released.

The dispersing solvent containing the carbon nanotube is centrifuged by a centrifuge. The impurities such as metal catalyst and carbon lump are separated from the carbon nanotube.

The carbon nanotube is purified and cut in a predetermined size through the above processes. In addition, the carbon nanotube has excellent dispersibility in solution and forms strong chemical bonds with the polymer electrolyte due to carboxyl and hydroxyl groups attached to the surface and end of the carbon nanotube. Thus, the carbon nanotube prevents delamination and improves stacking strength.

A conductive nanomembrane according to another embodiment of the present invention will be explained below.

Figure 13:
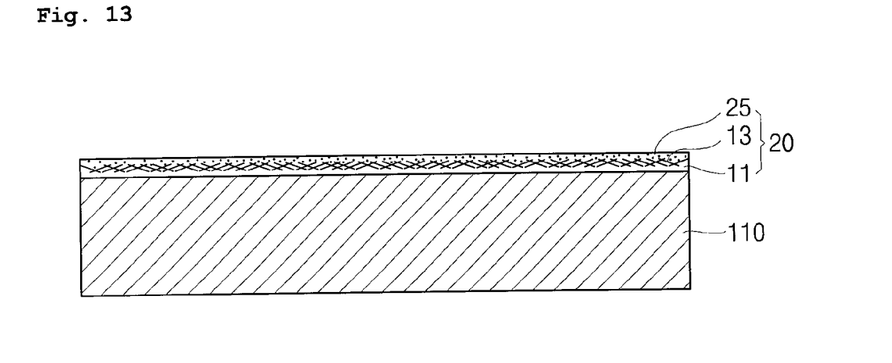
FIG. 13 is a sectional view illustrating a conductive nanomembrane according to another exemplary embodiment of the present invention.

FIG. 13 shows a sectional view of the conductive nanomembrane according to another embodiment of the present invention.

Referring to FIG. 13, the conductive nanomembrane 20 includes a lower polymer electrolyte film 11, a carbon nanotube layer 13 and an upper metal film 25 that are formed on a substrate 110.

In the conductive nanombranne 20, the upper metal film 25 is additionally formed in the conductive nanomembrane 10 of the embodiment of FIG. 1. Accordingly, the upper metal film 25 of the conductive nanomembrane 20 will be mainly explained below. In addition, the same drawing reference numerals are used for elements of the conductive nanomembrane 20 as the same as or similar to those of the conductive nanomembrane 10 of the embodiment of FIG. 1, and detailed explanation will be omitted.

The conductive nanomembrane 20 has low sheet resistance due to the upper metal film 25 formed on the carbon nanotube layer 13. The conductive nanomembrane 10 of the embodiment of FIG. 1 may have high sheet resistance due to contact resistance between the carbon nanotube and external electrode formed on the conductive nanomembrane. However, the 20 has relatively low sheet resistance due to the upper metal film 25.

The upper metal film 25 is formed of conductive metal on the carbon nanotube layer 13. The upper metal film 25 is formed of conductive metal such as copper, gold, silver and platinum. The upper metal film 25 is deposited in a thickness of about 5 nm by a method such as sputtering. When upper metal film 25 is formed as a platinum deposition film, the sheet resistance is decreased to 10 to 100 Ω/□.

The upper metal film 25 may form a composite with the carbon nanotube by a portion of the conductive metal filled between the carbon nanotubes. In other words, the upper metal film 25 may include a lower layer formed of the composite of the conductive metal and carbon nanotube and an upper layer formed of the conductive metal. In addition, the conductive metal of the upper metal film 25 may be filled overall between the carbon nanotubes, thereby allowing the upper metal film 25 to be formed as a single layer integrated with the carbon nanotube. The conductive nanomembrane 20 formed of the composite of the carbon nanotube and conductive metal has a relatively high mechanical strength and crack propagation caused by bending is reduced in comparison to the conductive nanomembrane formed of the sole metal layer. In addition, the carbon nanotube functions to bridge grain boundary of the upper metal film 25 electrically. Thus, the conductive nanomembrane 20 is formed as a very effective conductive layer that has a relatively low sheet resistance.

A conductive nanomembrane according to a still another embodiment of the present invention will be explained below.

Figure 14:
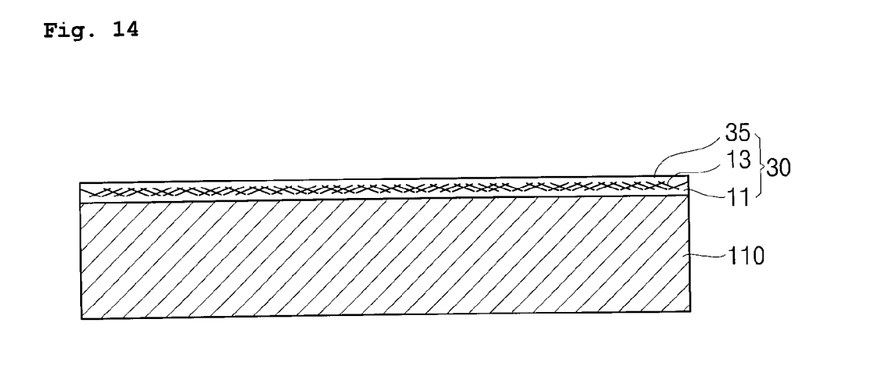
FIG. 14 is a sectional view illustrating a conductive nanomembrane according to a still another exemplary embodiment of the present invention.

FIG. 14 shows a sectional view of the conductive nanomembrane according to another embodiment of the present invention.

Referring to FIG. 14, the conductive nanomembrane 30 includes a lower polymer electrolyte film 11, a carbon nanotube layer 13 and an upper polymer electrolyte film 35 that are formed on a substrate 110.

In the conductive nanomembrane 30, the upper polymer electrolyte film 35 is additionally formed in the conductive nanomembrane 10 of the embodiment of FIG. 1. Accordingly, the upper polymer electrolyte film 35 of the conductive nanomembrane 30 will be mainly explained below. In addition, the same drawing reference numerals are used for elements of the conductive nanomembrane 30 as the same as or similar to those of the conductive nanomembrane 10 of the embodiment of FIG. 1, and detailed explanation will be omitted.

In the conductive nanomembrane 30, the upper polymer electrolyte film covers the carbon nanotube layer 13 entirely and fixes the carbon nanotube layer 13. The conductive nanomembrane 30 can be formed as a more strong film by the upper polymer electrolyte film 35.

The upper polymer electrolyte film 35 is formed of polymer electrolyte on the carbon nanotube layer 13. The upper polymer electrolyte film 35 is formed of the same polymer as the lower polymer electrolyte film 11. In other words, the upper polymer electrolyte film 35 is formed in a membrane of PAH or PSS.

The upper polymer electrolyte film 35 may be formed as a multi-layered film in which PAH and PSS are alternatively stacked. However, when the upper polymer electrolyte film 35 is formed as the multi-layered film, the lowermost layer contacted to the carbon nanotube layer 13 is formed of PAH having positive charge. Thus, the upper polymer electrolyte film 35 is strongly combined to the carbon nanotube layer 13 by electrostatic bonding.

On the other hand, a thickness of the conductive nanomembrane 30 can be adjusted by controlling the number of stacking PAH and PSS in the lower and upper polymer electrolyte films 11 and 35.

A MEMS sensor using the conductive nanomembrane according to the embodiment will be explained below.

Figure 15:
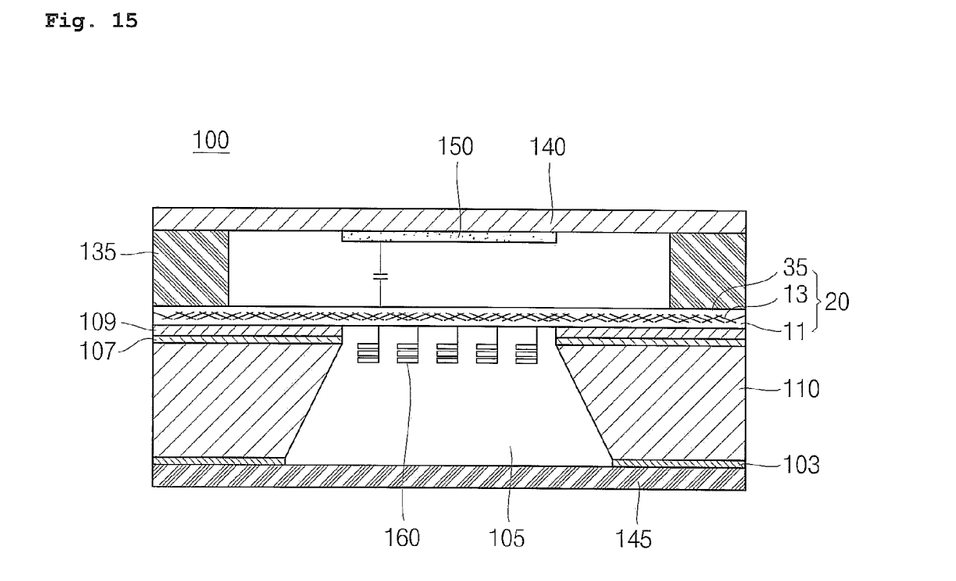
FIG. 15 is a sectional view illustrating a MEMS sensor using the conductive nanomembrane according to the embodiment.

FIG. 15 is a sectional view illustrating a MEMS sensor using the conductive nanomembrane according to the embodiment.

Figure 16:
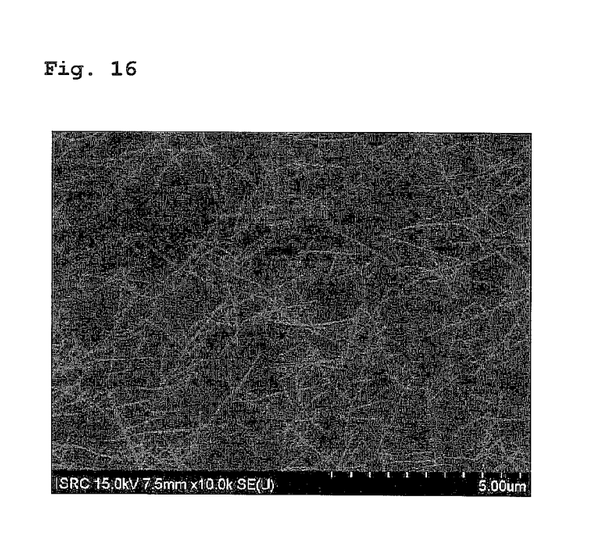
FIG. 16 is a photograph of the conductive nanomembrane provided with a carbon nanotube layer.
Figure 17:
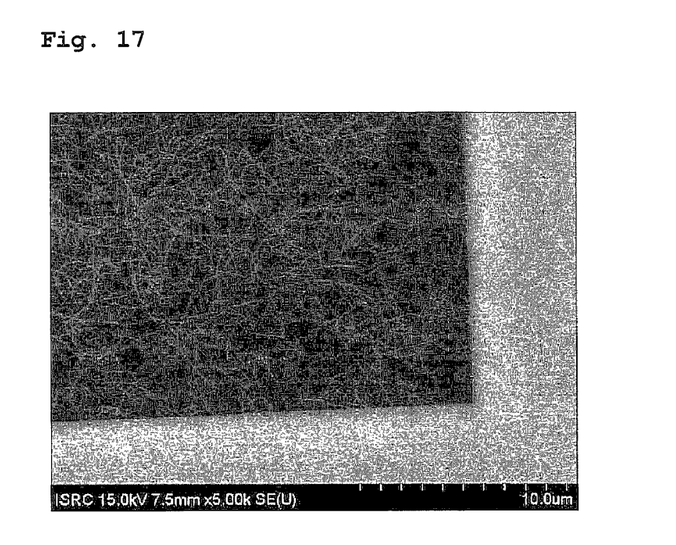
FIG. 17 is a photograph of the conductive nanomembrane and a spacer.

FIG. 16 is a photograph of the conductive nanomembrane provided with a carbon nanotube layer and FIG. 17 is a photograph of the conductive nanomembrane and spacer.

Performance of the MEMS sensor depends on mechanical and electrical properties of the conductive nanomembrane. The conductive nanomembranes 10, 20 and 30 used in the MEMS sensor are formed of polymer electrolyte that is electrically nonconductor and a carbon nanotube layer that is electrically conductor. Accordingly, the carbon nanotube layer improves the mechanical property of the conductive nanomembrane and simultaneously functions as a conductor of electricity. The carbon nanotube has excellent mechanical and electrical properties. The carbon nanotube is very useful to forming electrical network due to high aspect ratio thereof.

Referring to FIG. 15, the MEMS sensor 100 includes a substrate 110 provided with an opening 105 and a conductive nanomembrane 30 in which a lower polymer electrolyte film 11, a carbon nanotube layer 13 and an upper polymer electrolyte film 35 are sequentially stacked on the substrate 110 including the opening 105. Referring to FIG. 16, the carbon nanotube layer 13 is formed on the upper surface of the conductive nanomembrane 30. In addition, the MEMS sensor 100 includes an upper plate 140 provided on the conductive nanomembrane 30 with being spaced by a spacer 135, a lower plate 145 provided under the substrate 110 and an upper electrode 150 formed under the upper plate 140. Referring to FIG. 17, the conductive nanomembrane 30 is exposed through an opening of the spacer 135.

The upper electrode 150 is shown as a single electrode in FIG. 15, but may be formed in an array of a plurality of electrodes if it is needed.

The MEMS sensor 100 may include a lower silicon nitride film 103 formed between the substrate 110 and lower plate 145. In addition, the MEMS sensor 100 may further include an upper silicon nitride film 107 and a metal layer 109 formed between the substrate 110 and conductive nanomembrane 30.

The unexplained reference numeral '160'? indicates a biomaterial fixed to the sensor.

The MEMS sensor 100 measures capacitance between the conductive nanomembrane 30 and upper plate 140 by using the upper electrode 150.

The MEMS sensor 100 may be used as various sensors such as pressure sensor, humidity sensor, temperature sensor, contact sensor and biochemical sensor according to an object to be sensed.

The pressure sensor is deformed when pressure is applied to the conductive nanomembrane and measures pressure by using capacitance change. In addition, the humidity sensor measures humidity by measuring capacitance change by using change of dielectric ratio of medium (air) existing between the upper metal electrode 150 and conductive nanomembrane according to humidity change. The temperature sensor measures temperature by measuring capacitance change by using change of dielectric ratio of the medium according to temperature change similarly to the humidity sensor.

The contact sensor measures contact by measuring capacitance change of the conductive nanomembrane that is formed in an array according to pressure induced by contact with the outside.

The biochemical sensor measures capacitance change from deformation of the conductive nanomembrane that is generated by change of surface energy of the conductive nanomembrane, where the change of the surface energy of the conductive nanomembrane occurs when biomaterial molecules or gas molecules are fixed/adsorbed to the lower part of the conductive nanomembrane.

A manufacturing method of the MEMS sensor of FIG. 15 will be explained below.

FIGS. 18 to 21 show the manufacturing process of the MEMS sensor.

Figure 18:
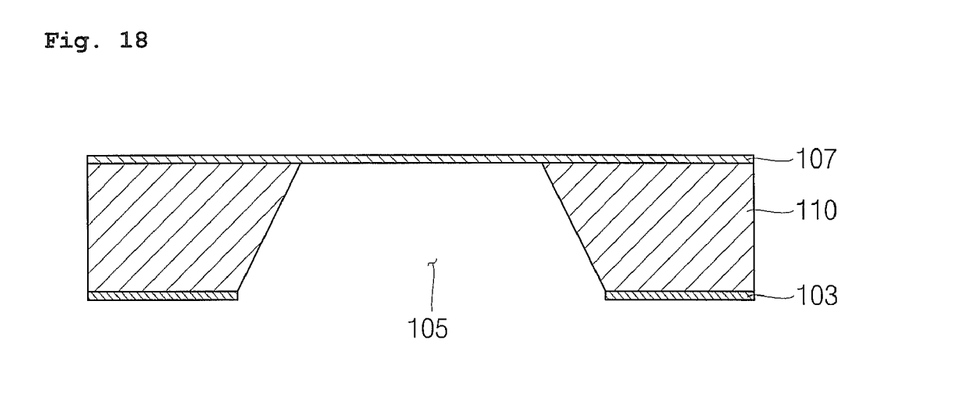
FIGS. 18 to 21 are sectional views illustrating manufacturing methods of the MEMS sensor.

Referring to FIG. 18, a lower silicon nitride film 103 is deposited under a substrate 110 and then a mask pattern 103 is formed by a usual etching process. An upper silicon nitride film ($Si_xN_y$) 107 is deposited on the substrate 110. Then, the lower part of the substrate 110 is etched by using the silicon nitride film mask 103 as an etching mask until the upper silicon nitride film 107 is exposed, thereby forming an opening 105. The opening 105 may be formed in various sizes and shapes.

Figure 19:
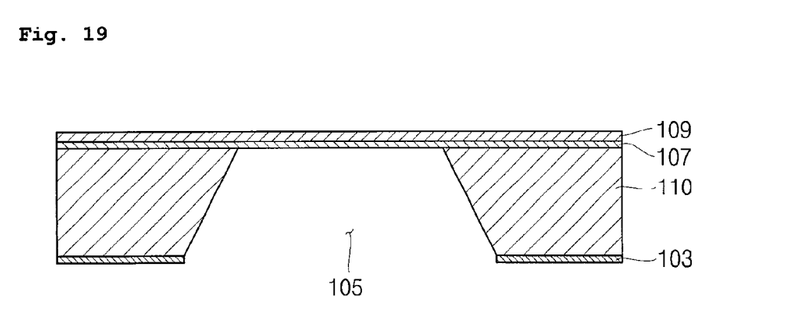

Referring to FIG. 19, a metal layer 109 is deposited on the upper silicon nitride film 107. the metal layer 109 uses hydrophilic metal having etching selectivity higher than a lower polymer electrolyte film 11 to be stacked thereon. The metal layer may be formed of titanium (Ti).

Figure 20:
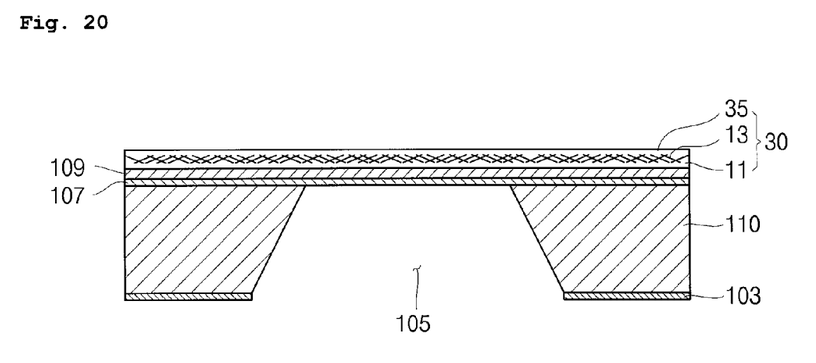

Referring to FIG. 20, a conductive nanomembrane 30 including the lower polymer electrolyte film 11, a carbon nanotube layer 13 and an upper polymer electrolyte film 35 on the metal layer 109 is formed. The metal layer 109 is hydrophilic and thus can be strongly combined to PAH that is the lowermost layer of the lower polymer electrolyte film 11.

Figure 21:
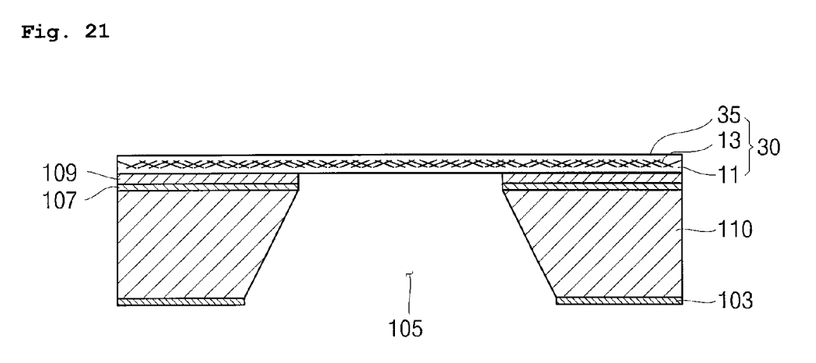

Referring to FIG. 21, the upper silicon nitride film 107 exposed to the opening 105 of the substrate 110 is dry-etched. In addition, the metal layer 109 is etched until the lower polymer electrolyte film 11 is exposed, thereby completing a membrane of the conductive nanomembrane 30 on the opening 105.

Next, a lower plate 145 is provided under the substrate 110 and an upper plate 140 provided with an upper electrode 159 is located on the substrate 110 while being spaced by a spacer 135, thereby completing the MEMS sensor shown in FIG. 14.

Operation of the MEMS sensor will be explained below.

The MEMS sensor 100 used as a biosensor will be explained for example below.

Most of conventional biosensors are based on a bio-optical detection method and thus, indispensably require phosphorylation process for biomaterial. In addition, a laser for activating phosphorous material and a fluorescent microscope for emitting biomaterial are required to detect optical characteristic.

In addition, a conventional fine cantilever type biosensor indispensably requires surface treatment to fix DNA to the surface of the cantilever. Usually used surface treatment methods include a method that a thin gold film is deposited on the cantilever and then thiol, that is, self-assembled monolayer is coated on the thin gold film, a Langmuir-Blodgett deposition method and sol-gel technique.

However, the biosensor using the MEMS sensor 100 uses capacitance change. Accordingly, all detection systems are integrated on a single biochip. Thus, miniaturization and lap-on-a-chip are possible.

In addition, in the conductive nanomembrane, an amine group (NH2) having positive charge of PAH of the lower polymer electrolyte film forms peptide bond with DNA having negative charge. Accordingly, DNA is directly fixed to the conductive nanomembrane and thus additional surface treatment is not required. In other words, the conductive nanomembrane does not require additional phosphorylation and surface treatment of the substrate for optical detection and specific binding, and has an advantage in that DNA can be directly fixed to the polymer electrolyte film.

In addition, the symmetrical structure in the direction of thickness of the conductive nanomembrane may provide the best solution for preventing bimetal effect that is very serious problem in the bio-mechanical detection method using the fine cantilever arrangement.

Table 1 shows property comparison result between the biosensor using the conductive nanomembrane and a sensor using the conventional fine cantilever arrangement.

TABLE 1

|  | biosensor using the conductive nanomembrane | sensor using the fine cantilever arrangement |
| --- | --- | --- |
| Phosphorous material attachment | Not required | Not required |
| Detection resolution | Very high | Very high |
| Temperature sensitivity | No | High |
| Surface treatment | Not required | Required and complicated |
| Miniaturization | Lap-on-a-chip type of sensor arrangement and detection system | Miniaturization of displacement system is very difficult |

Referring to Table 1, it can be confirmed that the biosensor of the present invention has excellent effects in comparison to the conventional sensor using the fine cantilever arrangement.

The conductive nanomembrane can improve performance of various sensors using a membrane such as pressure sensor, inertia sensor, gas sensor, humidity sensor and fingerprint sensor in addition to application in the biosensor.

It should be understood by those of ordinary skill in the art that various replacements, modifications and changes in the form and details may be made therein without departing from the spirit and scope of the present invention as defined by the following claims. Therefore, it is to be appreciated that the above described embodiments are for purposes of illustration only and are not to be construed as limitations of the invention.

INDUSTRIAL APPLICABILITY

The conductive nanomembrane using the carbon nanotube and polymer electrolyte film can be used in the MEMS sensor based on measurement of capacitance change. The MEMS sensor using the conductive nanomembrane can improve performance and reliability.

The invention claimed is:

1. A conductive nanomembrane, comprising:
a lower polymer electrolyte film;
a carbon nanotube layer formed on the lower polymer electrolyte film, where a network of carbon nanotubes are formed in the carbon nanotube layer, and wherein the carbon nanotubes of the carbon nanotube layer are functionalized with carboxyl and hydroxy groups and have a negative charge from hydrogen ions that are released from the carbon nanotube layer in aqueous solution; and
an upper polymer electrolyte film formed on the carbon nanotube layer,
wherein the lower polymer electrolyte film is formed by alternately stacking PAH and PSS, such that an uppermost layer of the lower polymer electrolyte film which contacts the carbon nanotube layer is formed of PAH.

2. A conductive nanomembrane, comprising:
a lower polymer electrolyte film;
a carbon nanotube layer formed on the lower polymer electrolyte film, where a network of carbon nanotubes are formed in the carbon nanotube layer, and wherein the carbon nanotubes of the carbon nanotube layer are functionalized with carboxyl and hydroxy groups and have a negative charge from hydrogen ions that are released from the carbon nanotube layer in aqueous solution; and
an upper polymer electrolyte film formed on the carbon nanotube layer,
wherein the upper polymer electrolyte film is formed by alternately stacking PAH and PSS, such that a lowermost layer of the upper polymer electrolyte film which contacts the carbon nanotube layer is formed of PAH.

3. A micro electro mechanical system (MEMS) sensor, comprising:
a substrate provided with an opening;
a conductive nanomembrane formed on the substrate provided with the opening, the conductive nanomembrane including:
a lower polymer electrolyte film; and
a carbon nanotube layer formed on the lower polymer electrolyte film, where a network of carbon nanotubes are formed in the carbon nanotube layer;
an upper plate, provided on the conductive nanomembrane, being spaced from the conductive nanomembrane by a spacer;
a lower plate provided under the substrate; and
an upper electrode, formed under the upper plate, being spaced from an upper surface of the conductive nanomembrane.

4. The MEMS sensor of claim 3, wherein the conductive nanomembrane is exposed through an opening of the spacer.

5. The MEMS sensor of claim 3, wherein the micro electro mechanical system sensor is formed as a pressure sensor, a humidity sensor, a temperature sensor, a contact sensor or a biochemical sensor according to an object to be sensed.

6. The MEMS sensor of claim 3, wherein the conductive nanomembrane further includes an upper polymer electrolyte film formed on the carbon nanotube layer.

7. The MEMS sensor of claim 3, wherein the conductive nanomembrane further includes an upper metal layer formed of any one metal selected from a group consisting of copper, gold, silver and platinum.

8. The MEMS sensor of claim 6, wherein the lower and upper polymer electrolyte films are respectively formed of any one resin selected from a group consisting of PAH, PSS, PVP, PAA, PPy, PANI, PTs and PEDOT.

9. The MEMS sensor of claim 6, wherein the carbon nanotube of the carbon nanotube layer are functionalized with carboxyl and hydroxy groups and have a negative charge from hydrogen ions that are released from the carbon nanotube layer in aqueous solution.

10. The MEMS sensor of claim 6, wherein the lower and upper polymer electrolyte films are formed by either a dipping self-assembly method or a spin-assisted self-assembly method.

11. The MEMS sensor of claim 9, wherein the lower polymer electrolyte film is formed by alternately stacking PAH and PSS, such that an uppermost layer of the lower polymer electrolyte film which contacts the carbon nanotube layer is formed of PAH.

12. The MEMS sensor of claim 9, wherein the upper polymer electrolyte film is formed by alternately stacking PAH and PSS, such that a lowermost layer of the upper polymer electrolyte film which contacts the carbon nanotube layer is formed of PAH.

* * * * *